US012689336B2

(12) United States Patent
Mahaseth et al.

(10) Patent No.: US 12,689,336 B2
(45) Date of Patent: Jul. 21, 2026

(54) AMPLIFIER SYSTEM

(71) Applicant: Taiwan Semiconductor Manufacturing Company, Ltd., Hsinchu (TW)

(72) Inventors: Kunal Mahaseth, Hsinchu (TW); Hsieh-Hung Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 517 days.

(21) Appl. No.: 18/340,872

(22) Filed: Jun. 25, 2023

(65) Prior Publication Data

US 2024/0283416 A1     Aug. 22, 2024

Related U.S. Application Data

(60) Provisional application No. 63/485,983, filed on Feb. 20, 2023.

(51) Int. Cl.
H03F 3/195      (2006.01)
H03F 1/56       (2006.01)

(52) U.S. Cl.
CPC ............. *H03F 3/195* (2013.01); *H03F 1/565* (2013.01); *H03F 2200/222* (2013.01); *H03F 2200/387* (2013.01); *H03F 2200/451* (2013.01)

(58) Field of Classification Search
CPC ................................. H03F 3/195; H03F 3/191
USPC .................................................. 330/307, 302
See application file for complete search history.

(56) References Cited

U.S. PATENT DOCUMENTS

| | | | | |
|---|---|---|---|---|
| 6,023,095 A * | 2/2000 | Hirabayashi | ............ | H01L 24/03 257/659 |
| 6,373,348 B1 * | 4/2002 | Hagerup | ................. | H01L 24/49 330/144 |
| 7,031,558 B2 * | 4/2006 | Tanbakuchi | ........ | G02F 1/01708 359/254 |
| 2004/0145415 A1 * | 7/2004 | Sun | ........................... | H03F 1/32 330/295 |
| 2021/0408978 A1 * | 12/2021 | Chidurala | ............. | H01L 23/047 |

* cited by examiner

*Primary Examiner* — Henry Choe
(74) *Attorney, Agent, or Firm* — Merchant & Gould P.C.

(57) ABSTRACT

An amplifier system includes an input pad having an input shunt capacitance, an output pad having an output shunt capacitance, and a high frequency amplifier including an input terminal coupled to the input pad and an output terminal coupled to the output pad. The input shunt capacitance is greater than the output shunt capacitance.

20 Claims, 7 Drawing Sheets

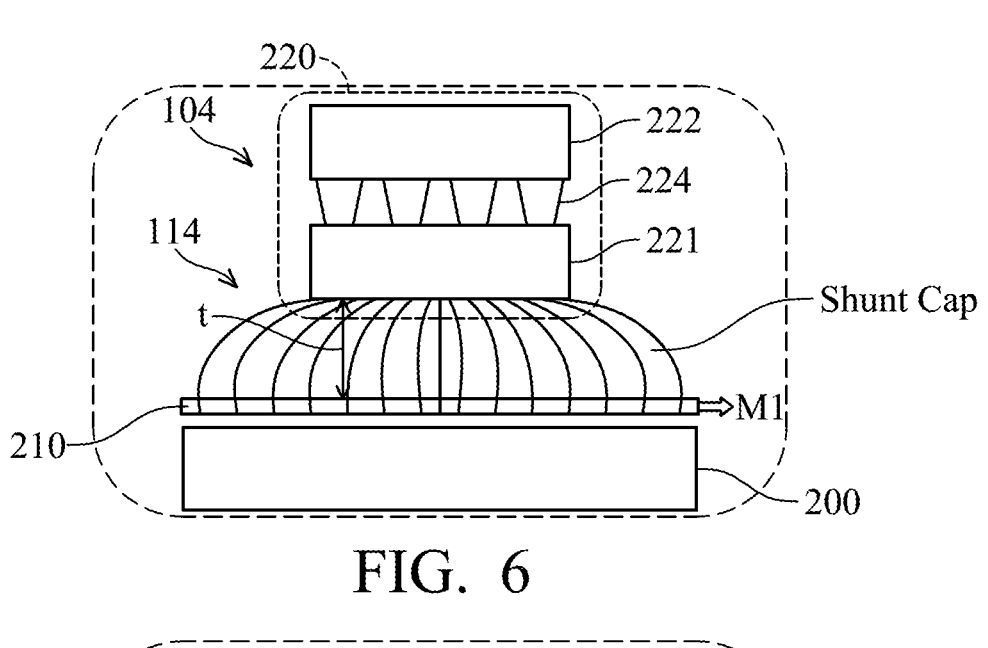
FIG. 6
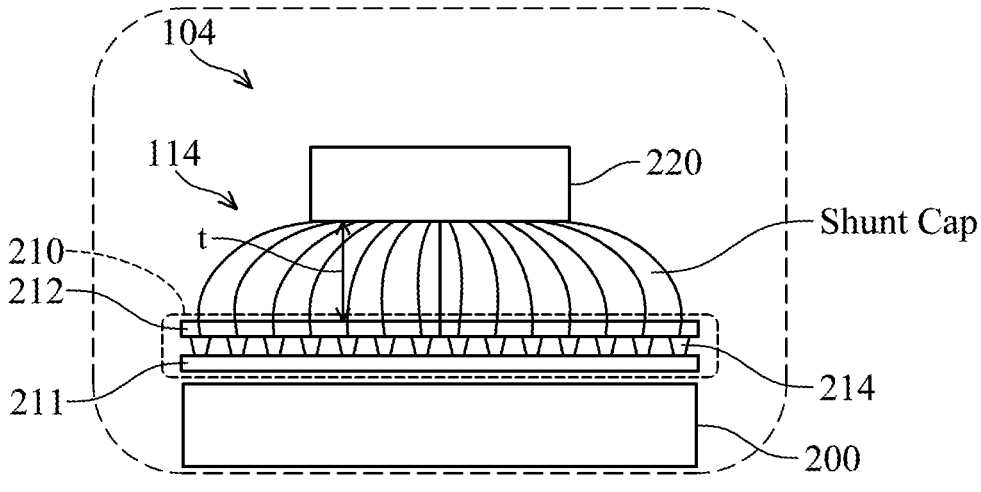
FIG. 7
FIG. 8

300

310 — Provide substrate

312 — Form bottom conductive layer

314 — Form top conductive layer

316 — Connect input pad to amp circuit

318 — Form output pad

320 — Connect output pad to amp circuit

AMPLIFIER SYSTEM

CROSS REFERENCE

This application claims the benefit of U.S. Provisional Patent Application No. 63/485,983, filed on Feb. 20, 2023, which is incorporated by reference.

BACKGROUND

Millimeter-wave (mm-wave) frequencies generally refer to radio frequency (RF) signals in the frequency band between approximately 30 GHz to 300 GHz, which are frequently used in various applications such as wireless personal area networks (WPANs), automobile radar, image sensing, etc. Various low noise amplifiers (LNAs) for RF circuits, including millimeter wave circuits, have been disclosed. For example, some millimeter-wave LNAs may be implemented using complementary metal oxide semiconductor (CMOS) cascode structures for multi-stage LNAs. For such LNA circuits, impedance matching for amplifier input and output terminals is generally employed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 6 is a side view conceptually illustrating another example of an input pad in accordance with disclosed embodiments.

FIG. 7 is a side view conceptually illustrating a further example of an input pad in accordance with disclosed embodiments.

FIG. 8 is a side view conceptually illustrating yet another example of an input pad in accordance with disclosed embodiments.

DETAILED DESCRIPTION

Figure 1:
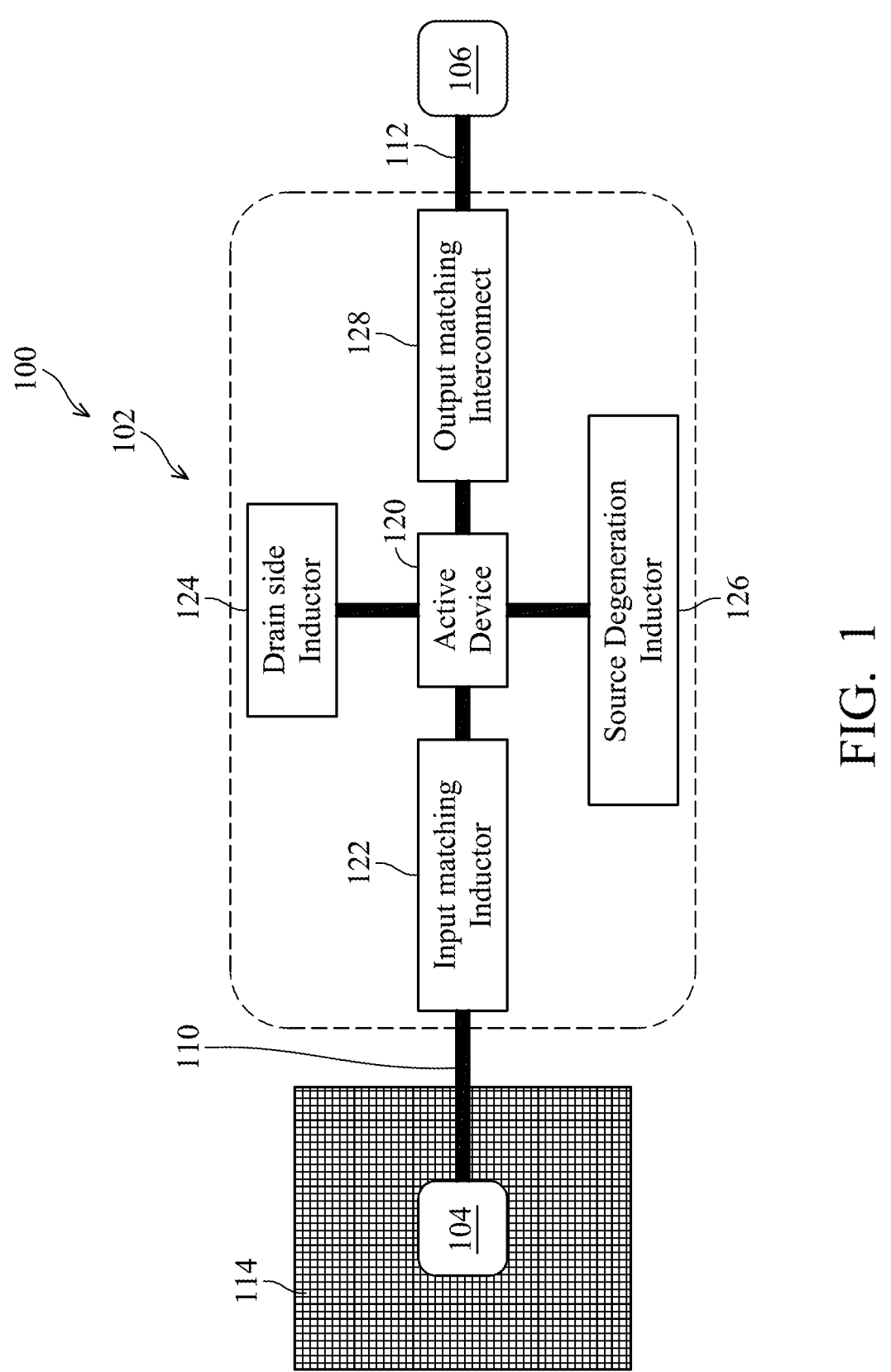
FIG. 1 is a block diagram illustrating an example of a high frequency amplifier system in accordance with disclosed embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For high frequency circuits, such as millimeter wave circuits (e.g. signals in the frequency band between approximately 30 GHz to 300 GHz), impedance matching at input and output terminals is typically provided. Such impedance matching may be impacted by on-chip inductors, interconnects, shunt capacitance of input and output pads, low resistance substrate loss, parasitic inductance/capacitance of active devices and passive elements, etc. For instance, various low noise amplifier (LNA) circuits may be employed for high frequency circuits. Such LNAs may be implemented using complementary metal oxide semiconductor (CMOS) cascode structures for multi-stage LNAs. Such circuits may include, for example, an RF amplifier gain stage, an oscillator and mixer implemented by common-source transistor or cascode structures. Input, output and inter-stage matching networks may be realized by using passive inductive and capacitive elements.

Conventional CMOS mm wave amplifier designs use large sized inductors for input signal matching and inductive source degeneration. These large sized inductors used for such input matching and inductive source degeneration can result in large on-chip area, and degraded gain and noise performance due to higher parasitics associated with the large sized inductors. Further, due to lossy inductors and higher parasitics of passive elements at mm wave frequencies, CMOS mm wave applications can suffer from input and output matching issues in addition to gain and noise performance, and DC power degradation. Multiple amplifier stages may be employed to improve gain, but this comes at the cost of higher DC power consumption. Moreover, high shunt capacitance of shielded output pads can degrade 3 dB bandwidth for mm wave CMOS applications.

In accordance with aspects of the present disclosure, impedance matching improvement for high frequency amplifiers is provided by including input and/or output pad considerations with input and output impedance matching circuit designs. For instance, improvement in input matching is achieved by shielding input pads to increase input shut capacitance, and output matching improvement is achieved with shunt capacitance reduction with un-shielded output pads. This can lead to higher gain, improved 3 dB bandwidth, improved noise performance and on-chip circuit area reduction by facilitating the use of smaller inductors.

FIG. 1 is a block diagram illustrating an example of an amplifier system 100 in accordance with aspects of the present disclosure. The amplifier system 100 includes a high frequency amplifier circuit 102. An input pad 104 is coupled to an input terminal 110 of the amplifier circuit 102, and an output pad 106 is coupled to an output terminal 112 of the amplifier circuit 102. In the illustrated example, the input pad 104 is a shielded input pad 104 (i.e. includes a shielding structure 114). Further, in some examples, the output pad 106 is an unshielded pad.

The input terminal 110 and input pad 104 are connected to one or more active device(s) 120 of the amplifier circuit 102 through an input matching circuit 122. The active device 120 is further connected to a drain side inductor circuit 124 and a source degeneration circuit 126. The active device 120 is also connected to the output terminal 112 and output pad 106 through an output matching circuit 128.

Figure 2:
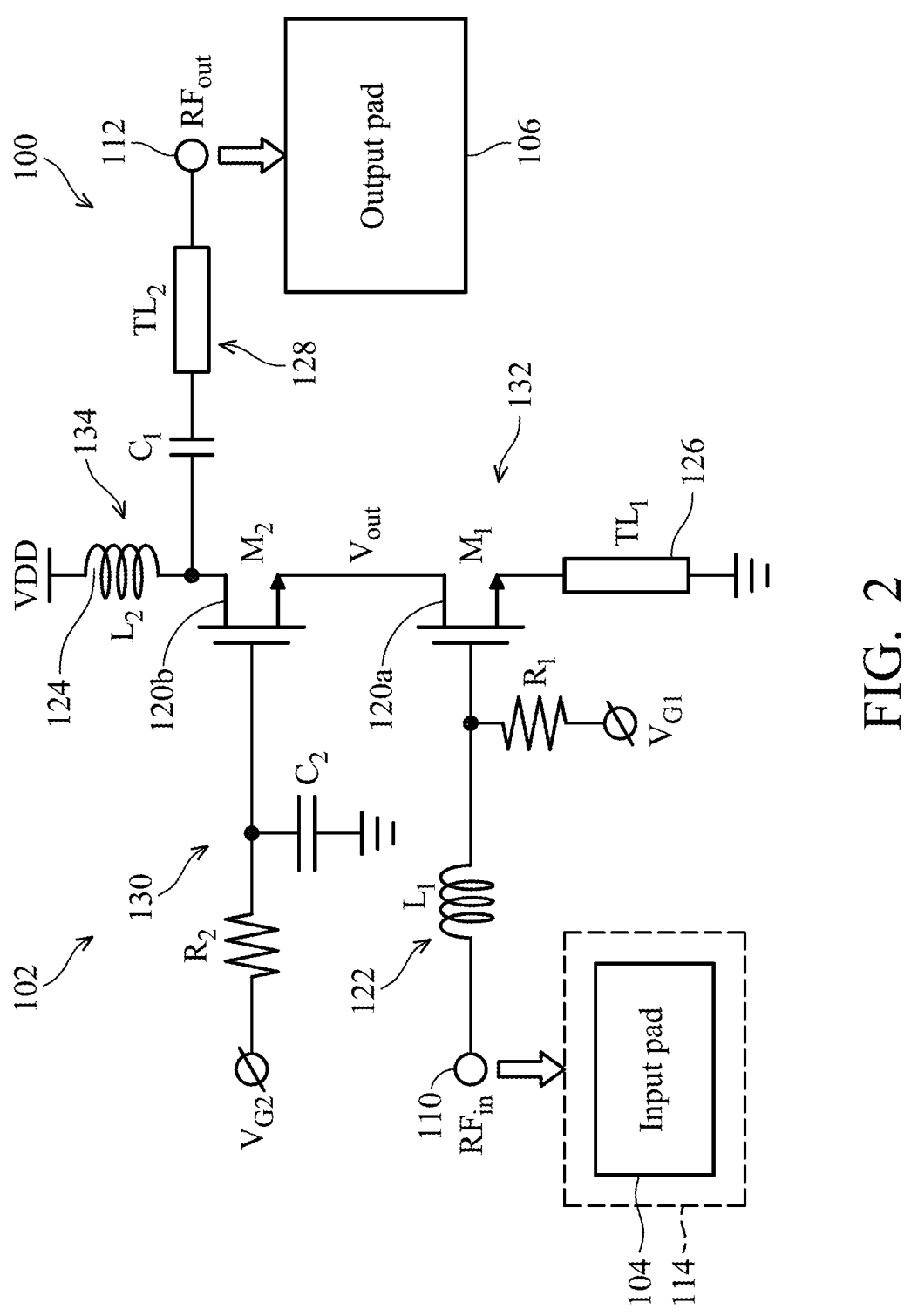
FIG. 2 is a schematic diagram illustrating further aspects of the high frequency amplifier system shown in FIG. 1 in accordance with disclosed embodiments.

FIG. 2 is a schematic diagram illustrating further aspects of the amplifier system 100. As in the example of FIG. 2, the amplifier system 100 includes the high frequency amplifier circuit 102, with the shielded input pad 104 coupled to the input terminal 110 and the unshielded output pad 106 coupled to the output terminal 112. In other examples, the output pad 106 is also shielded.

In some implementations, the amplifier circuit 102 employs a cascode circuit 130, which is a two-stage amplifier that includes a common source circuit 132 feeding into a common gate circuit 134. More specifically, the output of the common source circuit 132 is connected to the input of the common gate circuit 134. As such, the input signal RFin received at the input pad 104 is first amplified by the common source circuit 132, and its amplified output signal is further amplified by the common gate circuit 134.

The common source circuit 132 includes an active device 120a such as a CMOS transistor M1 having a gate terminal that receives the input signal RFin from the input pad 104, and an output node Vout at its drain terminal. The input matching circuit 122 including an input matching inductor L1 and a resistor R1 is connected between the input terminal 110 and the gate terminal of the transistor M1. The resistor R1 is further connected to receive a voltage signal VG1. The source degeneration circuit 126 is provided by a first transmission line TL1 connected between a source terminal of transistor M1 and a ground terminal. The source degeneration circuit 126 improves the bias current of the input circuit when large signals are applied, thus increasing circuit dynamic characteristics.

The common gate circuit 134 includes an active device 120b, which in the illustrated example is a CMOS transistor M2. The transistor M2 receives a gate signal VG2 at its gate terminal. The source terminal of the transistor M2 is connected to the Vout terminal of the common source circuit 132 (i.e. the drain terminal of the transistor M1). In the example shown in FIG. 2, the gate signal VG2 is received by the transistor M2 through an RC voltage divider circuit that includes a resistor R2 and capacitor C2. The drain side inductor circuit 124 includes an inductor L2 connected between the drain terminal of the transistor M2 and a VDD terminal. In some examples, the VDD terminal receives a voltage signal of 0.9V. The output matching circuit 128 is connected between the output of the common gate circuit 134 (i.e. the drain terminal of the transistor M2) and the output terminal 112. The output matching circuit 128 in the example shown in FIG. 2 includes a second transmission line TL2 connected in series with a capacitor C1.

Some examples of the illustrated amplifier system 100 provide input matching improvement for mm wave amplifiers without gain and noise performance degradation by shielding the input pad 104 to have extra shunt capacitance at the amplifier input 110. The pad 104 thus acts as a shunt capacitor, and the shunt capacitance of the pad 104 may then be considered in design of the input matching circuit 122, facilitating optimization of input inductors (e.g. inductor L1) and inductive source degeneration (e.g. transmission line TL1).

For instance, the size and values of the inductor L1 and transmission line TL1 may be adjusted by taking into account the added shunt capacitance provided by the shielded pad 104. Input matching including the shunt capacitance resulting from the shielding structure 114 of the input pad 104 can lead to smaller inductor(s), such as the inductor L1 and transmission line TL1, at the input side and for source degeneration, which leads to reduced parasitics at high frequencies such as mm wave frequencies. This can further lead to improved noise reduction and gain performance (e.g. through reduced DC power consumption), reducing or eliminating the need for multiple amplifier stages. The smaller sized inductors or other passive components also reduce chip area requirements for the overall amplifier circuit. Further, some examples employ an unshielded output pad 106, which reduces output shunt capacitance, thereby improving output impedance matching and improving 3 dB bandwidth performance. In other words, in some disclosed examples, the input pad 104 has an input shunt capacitance that is higher than the output shunt capacitance of the output pad 106.

Figure 3:
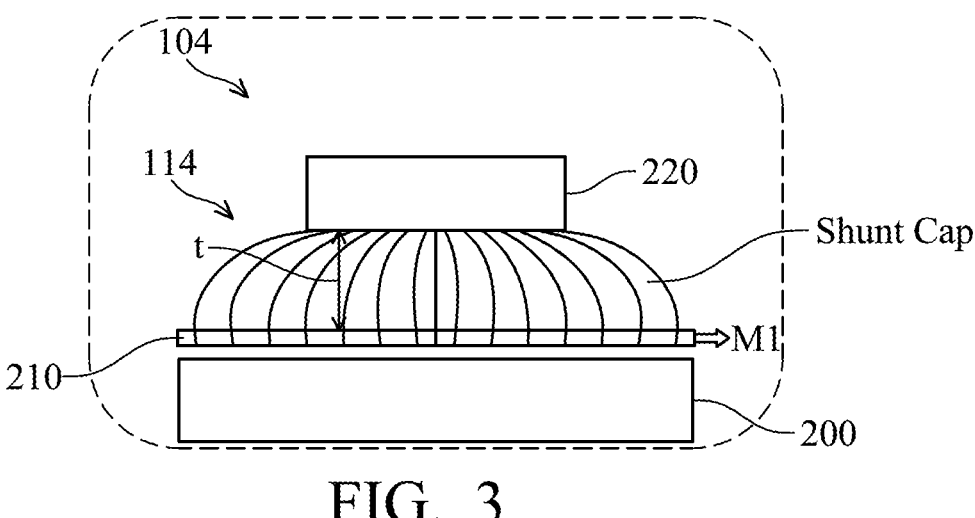
FIG. 3 is a side view conceptually illustrating an example of an input pad in accordance with disclosed embodiments.

FIG. 3 illustrates aspect of an example of the input pad 104. As noted above, the input pad 104 includes the shielding structure 114. Disclosed shielding structures 114 are applicable for various pad shielding methodologies and pad shapes. The pad 104 may include, for example, various types of on-chip RF pads such as bond pads with embedded inductors, bond pads with a patterned ground shield, flip chip pads, bond pads with various substrate constructions (e.g. additional diffusion layers in the pad region), ground-signal-ground (GSG) pads, and the like. Moreover, the disclosed input pad 104 is applicable for various mm wave frequency signals, including 300 GHz signals.

In the example of FIG. 3, the input pad 104 includes spaced conductors such that the pad 104 forms a shunt capacitor, which is used along with other passive components such as the inductor L1 of the input matching circuit 122 and/or the transmission line TL1 of the source degeneration circuit 126. The input pad 104 includes a substrate 200, with a bottom conductive layer 210 formed over the substrate 200. In some examples the bottom layer 210 is an M1 metal layer, which may be a ground layer. A top conductive layer 220 is formed over the bottom conductive layer 210 and is spaced apart from the bottom conductive layer 210 by a distance t to form an input shunt capacitor. In some examples, a dielectric material is formed between the bottom conductive layer 210 and the top conductive layer 220.

The input shunt capacitance resulting from the shielded input pad can be adjusted as desired for use with the other components of the input matching circuit 122 and/or source degeneration circuit 126, including varying the distance t that separates the bottom conductive layer 210 and the top conductive layer 220 and/or changing the sizes of one or more of the bottom conductive layer 210 and/or top conductive layer 220. The input shunt capacitance increases with a decrease in the separation distance t between the top conductive layer 220 and the bottom conductive layer 210.

Figure 4:
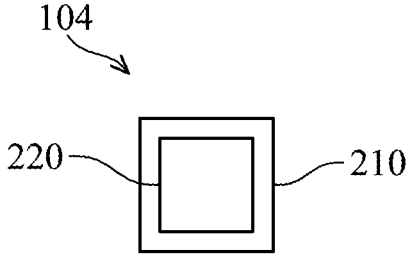
FIG. 4 is a top view illustrating further aspects of the example input pad shown in FIG. 3 in accordance with disclosed embodiments.
Figure 5:
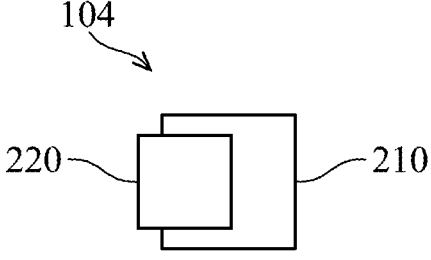
FIG. 5 is a top view illustrating further aspects of the example input pad shown in FIG. 3 in accordance with disclosed embodiments.

Moreover, the shunt capacitance can be varied by changing the relative size and/or position of the bottom conductive layer 210 and top conductive layer 220. FIG. 4 shows an example where the top conductive layer 220 is smaller than, and completely overlaps the bottom conductive layer 210 as viewed from above. Changing the position of the top conductive layer 220 relative to the bottom conductive layer 210 can change the shunt capacitance of the input pad 104. FIG. 5 illustrates an example where the top conductive layer 220 partially overlaps the bottom conductive layer 210 as viewed from above, which reduces the shunt capacitance since the amount of overlap is reduced. Increasing the size (i.e. area) of the top conductive layer 220 relative to the bottom conductive layer 210 would increase the shunt capacitance since the overlap area increases, while reducing the size (i.e. area) of the top conductive layer 220 relative to the bottom conductive layer 210 would decrease the shunt capacitance since the overlap area decreases.

FIG. 6 illustrates an example where the top conductive layer 220 includes a first top conductive layer 221 and a second top conductive layer 222 positioned over the first top conductive layer 221. The first and second top conductive layers 221, 222 may be formed with metal layers over the bottom conductive layer 210, which may comprise a first metal layer M1. Further, the first top conductive layer 221 may be electrically connected to the second top metal layer 222 by any suitable conductive structure. In the illustrated example, conductive vias 224 electrically connect the first top conductive layer 221 to the second top metal layer 222. The conductive vias 224 may extend through a dielectric material deposited between the second top conductive layer 222 and the first top conductive layer 221.

The stacked top conductive layers 221 and 222 result in reducing the separation distance t between the top conductive layer 220 and the bottom conductive layer 210, which increases shunt capacitance. Further, the stacked top conductive layers 221 and 222 with the conductive vias 224 situated therebetween provide a thick top conductive layer 220 having lower resistance and thus higher conductivity. In the example of FIG. 6, the bottom conductive layer 210 is thin, thus with higher resistance and lower conductivity.

FIG. 7 illustrates an example where the bottom conductive layer 210 includes a first bottom conductive layer 211 and a second bottom conductive layer 212 positioned over the first bottom conductive layer 211. The first and second bottom conductive layers 211, 212 may be formed with successive metal layers over the substrate 200. The first bottom conductive layer 211 may be electrically connected to the second bottom metal layer 212 by any suitable conductive structure, such as conductive vias 214 shown in FIG. 7, which electrically connect the first bottom conductive layer 211 to the second bottom metal layer 212. The conductive vias 214 may extend through a dielectric material deposited between the second bottom conductive layer 212 and the first bottom conductive layer 211. One or both of the first bottom conductive layer 211 and/or the second bottom metal layer 212 may be connected to ground.

The stacked bottom layers 211 and 212 also may result in reducing the separation distance t between the top conductive layer 220 and the bottom conductive layer 210, which increases shunt capacitance. Further, the stacked bottom conductive layers 211 and 212 with the conductive vias 214 situated therebetween increase the thickness of the bottom conductive layer 210, thus reducing the resistance and increasing conductivity of the bottom conductive layer 210.

FIG. 8 illustrates a further example where both the bottom conductive layer 210 and the top conductive layer 220 are formed with stacked conductive layers, such as stacked metal layers. More specifically, as shown in FIG. 8, the bottom conductive layer 210 includes the first bottom conductive layer 211 and the second bottom conductive layer 212 formed over the substrate 200. Conductive vias 214 electrically connect the first bottom conductive layer 211 to the second bottom conductive layer 212. Further, in the example of FIG. 8, the top conductive layer 220 includes the first top conductive layer 221 and the second top conductive layer 222 formed by metal layers over the bottom conductive layer 210. Conductive vias 224 electrically connect the first top conductive layer 221 to the second top metal layer 222.

The stacked bottom layers 211 and 212 and stacked top layers 221 and 222 further reduce the separation distance t between the top conductive layer 220 and the bottom conductive layer 210, thus increasing shunt capacitance. These stacked bottom conductive layers 211 and 212 and top conductive layers 221 and 222 with the respective conductive vias 214 and 224 situated therebetween increase the thickness of both the bottom conductive layer 210 and top conductive layer 220, thereby reducing the resistance and increasing conductivity of the both the bottom conductive layer 210 and top conductive layer 220.

Various configurations discussed above may be taken into consideration to vary input shunt capacitance as desired for design of the input matching circuit 122 and/or the source degeneration circuit 126. By considering the input shunt capacitance resulting from the shielded input pad 104 in this manner, passive components such as the inductor L1 and transmission line TL1 may be reduced, facilitating a reduction in the size of these components and reduced parasitics for RF input signals.

Figure 9:
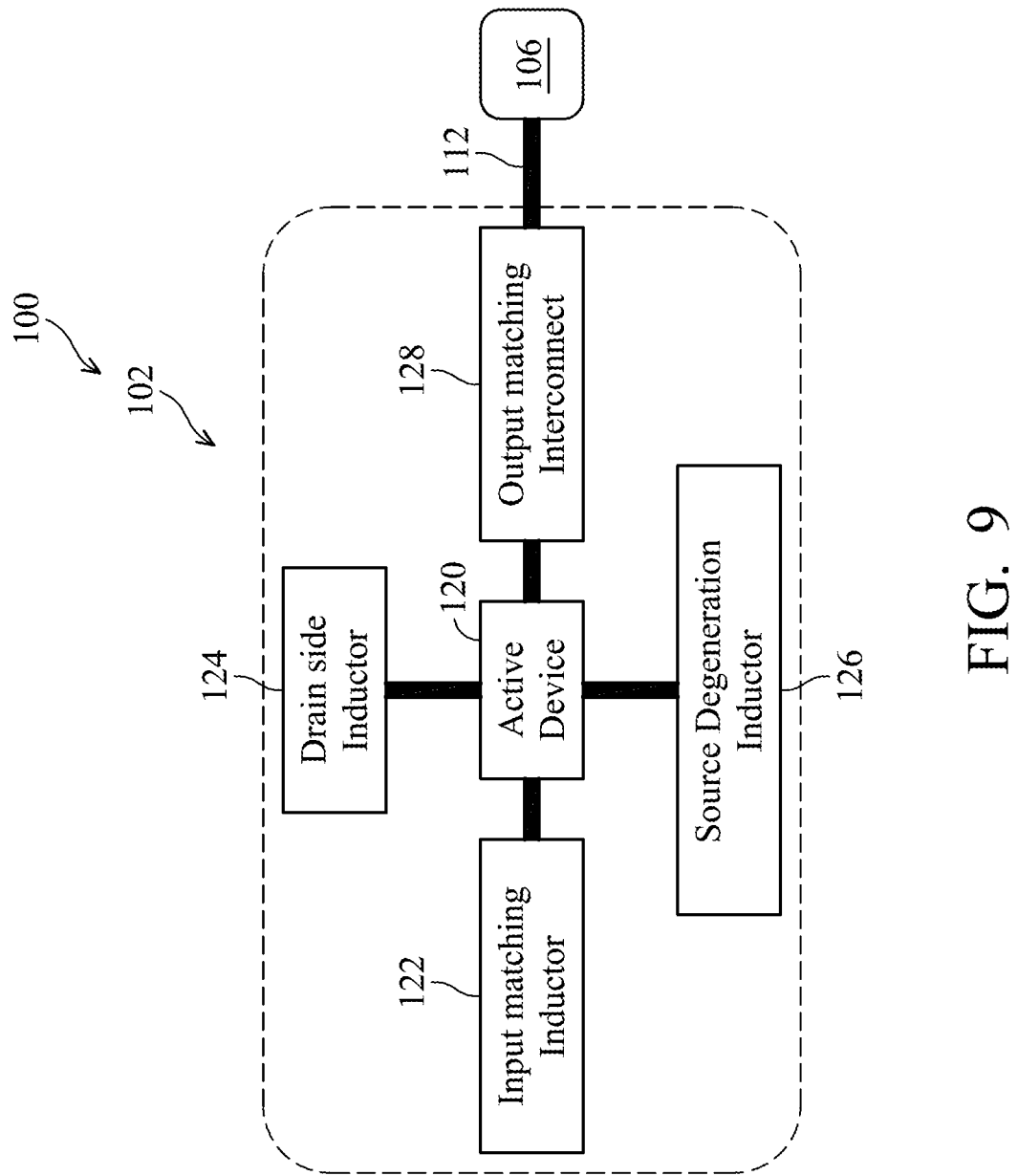
FIG. 9 is a block diagram illustrating further aspects of the high frequency amplifier system shown in FIG. 1 in accordance with disclose embodiments.

In some examples, amplifier performance improvements, such as 3 dB bandwidth improvements, of the high frequency amplifier 102 is achieved by a reduction of shunt capacitance of the output pad 106 at the amplifier output terminal 112. Interaction of output shunt capacitance with the output matching circuit 128 can degrade 3 dB bandwidth of the high frequency amplifier 102 due to inductance/capacitance (LC) interaction. Thus, as shown in the example of FIG. 9, an unshielded output pad 106 is employed. Various disclosed embodiments include a shielded input pad 104 as disclosed in the examples discussed above in which input shunted capacitance is increased, while the shunt capacitance of the unshielded output pad 106 is decreased. In other words, the shunt capacitance of the input pad 104 is greater than the shunt capacitance of the output pad 106 in some implementations.

Moreover, such an output pad 106 may include a ground layer with a conductive layer thereover that defines an output shunt capacitance. Such an output pad 106 using a shielding structure such as the embodiments using a stacked top layer 220 and/or a stacked bottom layer 210 may be configured to provide a lower output shunt capacitance than the input shunt capacitance of the input pad 104. For instance, the area of the output pad 106 conductor may be reduced. In embodiments where the output pad 106 includes a top conductive layer situated over a bottom or ground conductive layer, the size (i.e. area) of the top conductive layer may be reduced relative to the ground layer to reduce output shunt capacitance.

Improvements in performance of the high frequency amplifier 102 resulting from the shielded input pad 104 and/or the unshielded output pad 106 disclosed herein allow reducing the number of amplifier stages used for the high frequency amplifier 102. The examples discussed in conjunction with FIGS. 1-9 each have a single stage high-frequency amplifier 102.

Figure 10:
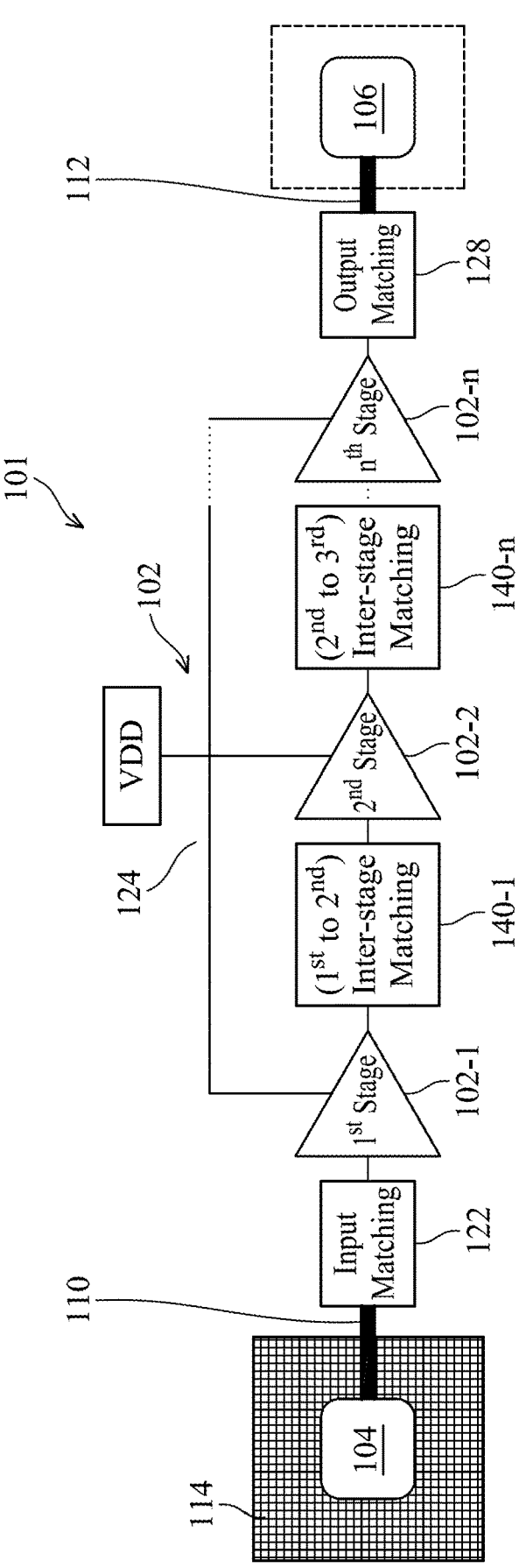
FIG. 10 is a block diagram illustrating an example of a multistage high frequency amplifier system in accordance with disclosed embodiments.

Disclosed aspects, however, are not limited to single stage amplifiers. FIG. 10 illustrates an example amplifier system 101 that includes a shielded input pad 104, such as the input pad 104 disclosed and discussed in conjunction with FIGS. 3-8, and an unshielded output pad 106 such as that discussed in conjunction with FIG. 9.

The embodiment of the system 101 shown in FIG. 10 includes a high frequency amplifier circuit 102 having multiple amplifier stages. More specifically, the high frequency amplifier circuit 102 of FIG. 10 has a first amplifier stage 102-1, a second amplifier stage 102-2 and so on to an $n^{th}$ amplifier stage 102-n. An input pad 104 is coupled to an input terminal 110 of the amplifier circuit 102, and an output pad 106 is coupled to an output terminal 112 of the amplifier circuit 102. In the illustrated example, the input pad 104 is a shielded input pad 104 (i.e. includes a shielding structure 114 such as in the examples discussed in conjunction with FIGS. 3-8 above). Further, in the illustrated example, the input pad 104 defines an input shunt capacitance, while the output pad 106 defines an output shunt capacitance different than (e.g. lower than) the input shunt capacitance. In some examples, the output pad 106 is an unshielded output pad. In other examples, the output pad 106 may also be shielded, but have an output shunt capacitance lower than the input shunt capacitance of the input pad 104.

The amplifier circuit 102 is connected to the input terminal 110 and input pad 104 through an input matching circuit 122, and is connected to the output terminal 112 and output pad 106 through an output matching circuit 128 similarly to the embodiment of FIGS. 1 and 2.

The multi-stage amplifier circuit 102 further has interstage matching circuits connected between each amplifier stage. More specifically, a first interstage matching circuit 140-1 is connected between the first amplifier stage 102-1 and the second amplifier stage 102-2, and an $n^{th}$ interstage matching circuit 140-n is connected between the second amplifier stage 102-2 and the last, or $n^{th}$ amplifier stage 102-n. In other words, an interstage matching circuit is connected between each amplifier stage and its successive amplifier stage.

As with the single stage amplifier systems 100 discussed above, input matching for the multi-stage amplifier system 101 shown in FIG. 10 benefits from the increased shunt capacitance from the shielded input pad 104, and output matching benefits from the reduced output shunt capacitance from the output pad 106. For example, the increased input shunt capacitance and reduced output shunt capacitance can reduce or prevent RF reflection and maintain signal integrity throughout the multiple gain stages 102-1 through 102-n.

Figure 11:
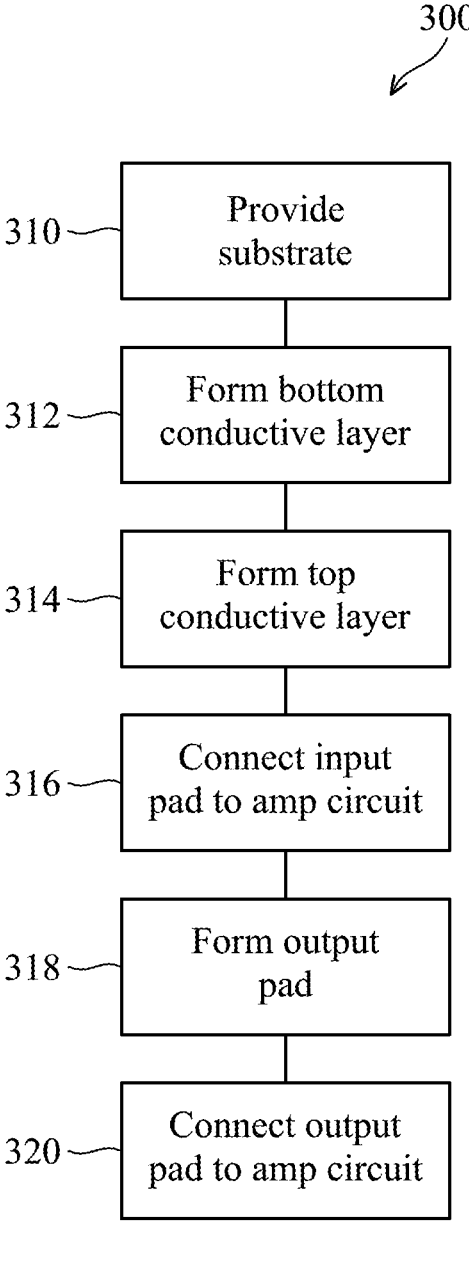
FIG. 11 is a flow diagram illustrating an example of a method in accordance with disclosed embodiments.

FIG. 11 illustrates an example of a method 300 in accordance with disclosed embodiments. The example shown in FIG. 11 is directed to a method for forming a high frequency amplifier system, such as the high frequency amplifier system 100 discussed above. More specifically, the method 300 includes forming an input pad such as the input pad 104 discussed above. Referring to FIG. 10 along with FIGS. 2-8, a substrate such as the substrate 200 is provided at operation 310. At operation 312, the bottom conductive layer 210 is formed over the substrate 200. The conductive layer 210 may be formed from a metal layer, such as a metal layer M1. A top conductive layer 220 is formed at operation 314. As shown in the example of FIG. 3, the top conductive layer 220 is spaced apart from the bottom conductive layer 210.

In some examples, a dielectric layer is formed over the bottom conductive layer 210 such that the dielectric layer separates the bottom conductive layer 210 from the top the conductive layer 220.

The distance t between the top conductive layer 220 and the bottom conductive layer 210 defines a shunt capacitance of the input pad 104. More specifically, the shunt capacitance increases as the separation distance t between the top conductive layer 220 and the bottom conductive layer 210 decreases. The input pad 104 is connected to the input terminal 110 of the amplifier circuit 102 at operation 316. The amplifier circuit 102 of operation 316 may be either a single stage amplifier circuit or a multi-stage amplifier circuit.

The input shunt capacitance of the input pad 104 formed in operations 310-314 may further be varied by varying the relative sizes (i.e. areas) of the top conductive layer 220 and bottom conductive layer 210. Still further, the shunt capacitance of the input pad 104 may be varied by varying the overlap of the top conductive layer 220 relative to the bottom conductive layer 210, as shown in FIG. 5 discussed above.

The output pad 106 is formed at operation 318, and the output pad 106 is connected to the output terminal 112 of the amplifier circuit 102 at operation 320. In some examples, the output shunt capacitance of the formed output pad 106 is lower than the input shunt capacitance of the formed input pad 104. Further, in some examples the output pad 106 is unshielded.

In some examples, connecting the input pad 104 to the amplifier circuit 102 in operation 316 includes connecting the input pad 104 to an input matching circuit 122 as shown in FIG. 1. The shielded input pad 104 formed at operations 310-314 provides additional input shut capacitance, facilitating optimization of inductor(s) and other passive components of the input matching circuit 122. Moreover, the input shunt capacitance provided by the shielded input pad 104 facilitates optimization of passive components, such as inductor(s) of the source degeneration circuit 126. This can allow a reduction in size of the aforementioned inductors, improving space utilization of the amplifier system 100. Further, the disclosed input pad 104 can reduce parasitics at high frequency, such as mm wave frequencies, received at the input pad 104.

In further examples, forming the bottom conductive layer 210 at operation 312 includes forming a first bottom conductive layer 211 over the substrate 200, and forming a second bottom conductive layer 212 over the first bottom conductive layer 211. The first bottom conductive layer 211 and the second bottom conductive layer 212 are electrically connected to one another, such as by conductive vias 214. Moreover, in some embodiments, forming the top conductive layer 220 at operation 314 includes forming a first top conductive layer 221 over the bottom conductive layer 210, and forming a second top conductive layer 222 over the first top conductive layer 221. The first top conductive layer 221 is electrically connected to the second top conductive layer 222, such as by conductive vias 224.

As noted above, for high frequency (e.g. mm wave frequencies) circuit design, impedance matching at input and output terminals is impacted by various on-chip components and factors. Large inductors used for inductive source degeneration and input matching with such high frequency devices can occupy significant on-chip area, and degrade gain and noise performance of the device due to higher parasitics. Considering the increased input shunt capacitance provided through the various shielded input pads 104 disclosed herein when designing input matching circuits and source degeneration circuits can result in using smaller inductors for such circuits, reducing area usage of such components while improving performance of the high-frequency device.

Additionally, reducing output shunt capacitance by providing an output pad having lower shunt capacitance as compared to the input shut capacitance in turn reduces fringing fields from top metal layers and improves 3 dB bandwidth performance for high frequency amplifiers. As noted above, such output shunt capacitance reduction may be achieved by various actions such as reducing the size of output pad conductive layers, reducing overlap of output pad conductive layers, and/or providing an unshielded output pad.

Thus, disclosed examples consider the input pad 104 and output pad 106 in the process of designing impedance matching and other aspects of the high frequency amplifier system 100/101. This provides gain performance, noise performance, and 3 dB bandwidth without increasing DC power consumption and increasing amplifier stages.

For instance, with one implementation using a GSG input pad 104 shielded according to the example shown in FIG. 3, input shunt capacitance is higher than 30 fF for mm wave frequencies. Moreover, Q-factor increased considerably, which improved noise performance. Input matching was improved for an example where a 79 GHz low noise amplifier was employed, while output matching was improved by the reduction in output shunt capacitance achieved through using an unshielded GSG output pad 106.

In accordance with aspects of the disclosure, an amplifier system includes an input pad having an input shunt capacitance and an output pad having an output shunt capacitance. A high frequency amplifier has an input terminal coupled to the input pad and an output terminal coupled to the output pad, and the input shunt capacitance is greater than the output shunt capacitance.

In accordance with further aspects, an amplifier system includes a high frequency amplifier with an input terminal and an output terminal. An input pad is coupled to the input terminal. The input pad has a substrate, a bottom conductive layer over the substrate, and a top conductive layer over the bottom conductive layer and spaced apart from the bottom conductive layer. An unshielded output pad is coupled to the output terminal.

In accordance with additional aspects of the disclosure, a method includes providing a substrate, and forming an input pad. Forming the input pad includes forming a bottom conductive layer over the substrate, and forming a top conductive layer over the bottom conductive layer such that the top conductive layer overlaps and is spaced apart from the bottom conductive layer. The input pad is connected to an input terminal of a high frequency amplifier circuit. An output pad is formed and connected to an output terminal of the high frequency amplifier circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An amplifier system, comprising:
an input pad including a substrate, a bottom conductive layer over the substrate; and a top conductive layer over the bottom conductive layer and spaced apart from the bottom conductive layer, the input pad having an input shunt capacitance;
an output pad having an output shunt capacitance; and
a high frequency amplifier including an input terminal coupled to the input pad and an output terminal coupled to the output pad;
wherein the input shunt capacitance is greater than the output shunt capacitance.

2. The amplifier system of claim 1, wherein the input pad is shielded.

3. The amplifier system of claim 1, wherein the output pad is unshielded.

4. The amplifier system of claim 1, wherein the bottom conductive layer includes a first bottom conductive layer over the substrate.

5. The amplifier system of claim 4, wherein the bottom conductive layer further comprises:
a second bottom conductive layer over the first bottom conductive layer and electrically connected to the first bottom conductive layer.

6. The amplifier system of claim 5, further comprising a conductive via connecting the first bottom conductive layer and the second bottom conductive layer.

7. The amplifier system of claim 4, wherein the top conductive layer comprises:
a first top conductive layer over the bottom conductive layer; and
a second top conductive layer over the first top conductive layer and electrically connected to the first top conductive layer.

8. The amplifier system of claim 7, further comprising a conductive via connecting the first top conductive layer and the second top conductive layer.

9. The amplifier system of claim 4, wherein the top conductive layer overlaps the bottom conductive layer.

10. The amplifier system of claim 1, wherein the high frequency amplifier comprises a single amplifier stage.

11. The amplifier system of claim 1, wherein the high frequency amplifier comprises a plurality of amplifier stages.

12. An amplifier system, comprising:
a high frequency amplifier including an input terminal and an output terminal;
an input pad coupled to the input terminal, the input pad including a substrate, a bottom conductive layer over the substrate, and a top conductive layer over the bottom conductive layer and spaced apart from the bottom conductive layer; and
an unshielded output pad coupled to the output terminal.

13. The amplifier system of claim 12, wherein the input pad has an input shunt capacitance, and the output pad has an output shunt capacitance lower than the input shunt capacitance.

14. The amplifier system of claim 12, wherein the bottom conductive layer comprises:
a first bottom conductive layer over the substrate;
a second bottom conductive layer over the first bottom conductive layer; and a conductive via electrically connecting the first bottom conductive layer and the second bottom conductive layer.

15. The amplifier system of claim 12, wherein the top conductive layer comprises:

a first top conductive layer over the bottom conductive layer;

a second top conductive layer over the first top conductive layer; and a conductive via electrically connecting the first top conductive layer and the second top conductive layer.

16. The amplifier system of claim 12, further comprising:

an input matching circuit connected between the input pad and the high frequency amplifier; and an output matching circuit connected between the output pad and the high frequency amplifier.

17. A method, comprising:

providing a substrate;

forming an input pad including forming a bottom conductive layer over the substrate, and forming a top conductive layer over the bottom conductive layer such that the top conductive layer overlaps and is spaced apart from the bottom conductive layer;

connecting the input pad to an input terminal of a high frequency amplifier circuit;

forming an output pad; and connecting the output pad to an output terminal of the high frequency amplifier circuit.

18. The method of claim 17, wherein the input pad has an input shunt capacitance, and the output pad has an output shunt capacitance lower than the input shunt capacitance.

19. The method of claim 17, wherein forming the input pad includes:

forming a first bottom conductive layer over the substrate;

forming a second bottom conductive layer over the first bottom conductive layer; and electrically connecting the first bottom conductive layer and the second bottom conductive layer.

20. The method of claim 17, wherein forming the input pad includes:

forming a first top conductive layer over the bottom conductive layer;

forming a second top conductive layer over the first top conductive layer; and electrically connecting the first top conductive layer and the second top conductive layer.

* * * * *